US012813084B2

(12) United States Patent
Shin et al.

(10) Patent No.: US 12,813,084 B2
(45) **Date of Patent: *Nov. 24, 2026**

(54) DISPLAY DEVICE AND MANUFACTURING METHOD THEREOF

(71) Applicant: Samsung Display Co., LTD., Yongin-si (KR)

(72) Inventors: Hyun Eok Shin, Yongin-si (KR); Joon Yong Park, Yongin-si (KR); Do Keun Song, Yongin-si (KR); Ju Hyun Lee, Yongin-si (KR); Yu-Gwang Jeong, Yongin-si (KR)

(73) Assignee: Samsung Display Co., LTD., Yongin-Si (KR)

( * ) Notice: Subject to any disclaimer, the term of this patent is extended or adjusted under 35 U.S.C. 154(b) by 378 days.

This patent is subject to a terminal disclaimer.

(21) Appl. No.: 18/423,329

(22) Filed: Jan. 26, 2024

(65) Prior Publication Data

US 2024/0306430 A1 Sep. 12, 2024

(30) Foreign Application Priority Data

Mar. 8, 2023 (KR) ........................ 10-2023-0030570

(51) Int. Cl.

*H10K 59/122* (2023.01)
*H10K 59/00* (2023.01)
*H10K 59/12* (2023.01)

(52) U.S. Cl.

CPC ....... *H10K 59/122* (2023.02); *H10K 59/1201* (2023.02); *H10K 59/771* (2023.02)

(58) Field of Classification Search

CPC .... H10K 59/122; H10K 59/771; H10K 50/17; H10K 50/11; H10K 59/1201

See application file for complete search history.

(56) References Cited

U.S. PATENT DOCUMENTS

| | | | | |
|---|---|---|---|---|
| 2020/0144342 | A1 | 5/2020 | Shim et al. | |
| 2022/0085125 | A1 | 3/2022 | Yun et al. | |
| 2022/0131104 | A1* | 4/2022 | Kim | H10K 59/124 |
| 2024/0292667 | A1* | 8/2024 | Shin | H10K 59/1201 |

FOREIGN PATENT DOCUMENTS

| | | |
|---|---|---|
| CN | 110603642 | 12/2019 |
| KR | 10-2007-0068147 A | 6/2007 |
| KR | 10-1291845 | 7/2013 |
| KR | 10-2020-0050547 A | 5/2020 |
| KR | 10-2021-0022206 | 3/2021 |
| KR | 10-2248875 | 5/2021 |
| KR | 10-2324833 | 11/2021 |
| KR | 10-2022-0035646 A | 3/2022 |
| KR | 10-2022-0055922 A | 5/2022 |
| KR | 10-2022-0088301 | 6/2022 |

* cited by examiner

*Primary Examiner* — Jose R Diaz

(74) *Attorney, Agent, or Firm* — Innovation Counsel LLP

(57) ABSTRACT

An embodiment provides a display device including transistors disposed on a substrate; an insulating layer disposed on the transistors; a first electrode disposed on the insulating layer and electrically connected to at least one of the transistors; a partition wall disposed on the insulating layer, and a common layer disposed on the partition wall and the first electrode, wherein the partition wall includes a groove, the groove has a shape having an inner width wider than an inlet width, and the common layer is disposed inside the groove.

25 Claims, 15 Drawing Sheets

DISPLAY DEVICE AND MANUFACTURING METHOD THEREOF

CROSS-REFERENCE TO RELATED APPLICATION

This application claims priority to and the benefit of Korean Patent Application No. 10-2023-0030570 under 35 U.S.C. § 119, filed in the Korean Intellectual Property Office (KIPO) on Mar. 8, 2023, the entire contents of which are incorporated herein by reference.

BACKGROUND

1. Technical Field

The disclosure relates to a display device and a manufacturing method thereof, and more specifically, to a display device and a manufacturing method thereof that may prevent current leakage between adjacent pixels.

2. Description of the Related Art

A light emitting display device may be a self-light emitting type of display device in which a voltage is applied to a thin film layer including a positive electrode, a negative electrode, and a light emitting layer disposed between the two electrodes, such that electrons and holes are recombined in the light emitting layer to emit light. The light emitting display device is attracting attention as a next-generation display device due to advantages such as a light weight and a thin shape, a wide viewing angle, a fast response speed, and low power consumption.

The light emitting display device includes a light emitting device (LED). The light emitting device has a structure in which a light emitting layer in the form of a functional thin film is inserted between an anode electrode and a cathode electrode, wherein holes are injected from the anode electrode and electrons are injected from the cathode electrode, and the electrons and holes are combined in the light emitting layer to form excitons, and the excitons emit light by recombination.

Recently, as a high-resolution display device is used, a size of one pixel is reduced and a distance between adjacent pixels is decreased.

SUMMARY

Embodiments are to provide a display device and a manufacturing method thereof. By virtue of the embodiments, technical problems including side current leakage in a high-resolution display device may be prevented.

An embodiment provides a display device including a plurality of transistors disposed on a substrate; an insulating layer disposed on the plurality of transistors; a first electrode disposed on the insulating layer and electrically connected to at least one of the plurality of transistors; a partition wall disposed on the insulating layer; and a common layer disposed on the partition wall and the first electrode, wherein the partition wall includes a groove, the groove has a shape having an inner width wider than an inlet width, and the common layer is disposed inside the groove.

The inner width of the groove may be substantially equal to or greater than about 1.5 times the inlet width of the groove.

The inlet width of the groove may be in a range of about 0.5 μm to about 3 μm.

The partition wall may include an inorganic material.

The common layer disposed on the first electrode and an adjacent common layer disposed on an adjacent first electrode may include a same material.

The common layer disposed on the first electrode may be separated from the adjacent common layer disposed on the adjacent first electrode by the groove.

The common layer may be a hole injection layer.

The hole injection layer may include a doped hole transport layer material.

The display device may further include a light emitting layer disposed on the common layer.

The light emitting layer may block an inlet of the groove.

The light emitting layer may be disposed inside the groove.

A height of the groove may be greater than a thickness of the common layer.

The height of the groove may be smaller than a thickness of the light emitting layer.

The display device may further include a second electrode disposed on the light emitting layer.

The second electrode may be formed of a single plate overlapping a plurality of first electrodes.

The partition wall may include a first layer and a second layer, and the groove may be disposed in the second layer.

The first layer and the second layer may include different materials.

Another embodiment provides a manufacturing method of a display device, including: preparing a substrate including a plurality of transistors and a first electrode connected at least one of to the plurality of transistors; forming a metal pattern on the substrate; forming a partition wall layer on the metal pattern; forming an opening overlapping the metal pattern by patterning the partition wall layer; etching the metal pattern to form a groove in the partition wall layer; and forming a common layer on the partition wall layer and the first electrode, wherein the groove has a shape having an inner width wider than an inlet width, and the common layer is formed inside the groove.

The inner width of the groove may be substantially equal to or greater than about 1.5 times the inlet width of the groove.

The common layer may be separated from an adjacent common layer disposed on the first electrode by the groove.

The common layer may be a hole injection layer.

The manufacturing method of the display device may further include forming a light emitting layer disposed on the common layer, wherein the light emitting layer may block an inlet of the groove.

The light emitting layer may be disposed inside the groove.

A thickness of the metal pattern may be greater than a thickness of the common layer.

The thickness of the metal pattern may be smaller than a thickness of the light emitting layer.

The manufacturing method of the display device may further include forming a second electrode on the light emitting layer, wherein the second electrode may be formed of a single plate overlapping a plurality of the first electrodes.

According to the embodiments, it is possible to provide a display device and a manufacturing method thereof that may prevent side current leakage in a high-resolution display device.

DETAILED DESCRIPTION OF THE EMBODIMENTS

Figure 1:
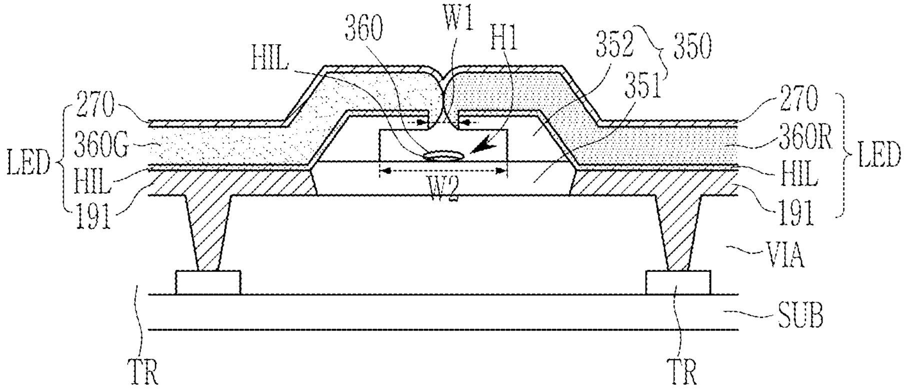
FIG. 1 illustrates a schematic cross-sectional view of a display device according to an embodiment.

The disclosure will be described more fully hereinafter with reference to the accompanying drawings, in which embodiments of the disclosure are shown. As those skilled in the art would realize, the described embodiments may be modified in various different ways, all without departing from the spirit or scope of the disclosure.

In order to clearly describe the disclosure, parts or portions that are irrelevant to the description are omitted, and identical or similar constituent elements throughout the specification are denoted by the same reference numerals.

Further, in the drawings, the size and thickness of each element may be arbitrarily illustrated for ease of description, and the disclosure is not necessarily limited to those illustrated in the drawings. In the drawings, the thicknesses of layers, films, panels, regions, areas, etc., may be exaggerated for clarity. In the drawings, for ease of description, the thicknesses of some layers and areas may be exaggerated.

It will be understood that when an element such as a layer, film, region, area, or substrate is referred to as being "on" or "above" another element, it can be directly on the other element or intervening elements may also be present. In contrast, when an element is referred to as being "directly on" another element, there are no intervening elements present. Further, in the specification, the word "on" or "above" means disposed on or below the object portion, and does not necessarily mean disposed on the upper side of the object portion based on a gravitational direction.

In addition, unless explicitly described to the contrary, the word "comprise," "include," "have," and their variations such as "comprises" or "comprising" will be understood to imply the inclusion of stated elements but not the exclusion of any other elements.

Further, throughout the specification, the phrase "in a plan view" or "on a plane" means viewing a target portion from the top, and the phrase "in a cross-sectional view" or "on a cross-section" means viewing a cross-section formed by vertically cutting a target portion from the side.

The term "and/or" includes all combinations of one or more of which associated configurations may define. For example, "A and/or B" may be understood to mean "A, B, or A and B."

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

The term "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, a display device and a manufacturing method thereof according to an embodiment will be described in detail with reference to the accompanying drawings. FIG. 1 illustrates a schematic cross-section of a display device according to an embodiment. Referring to FIG. 1, a display device according to the embodiment may include a substrate SUB and transistors TR disposed on the substrate SUB. For example, the substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, cellulose triacetate, and cellulose acetate propionate, or a combination thereof. The substrate SUB may be a rigid substrate or a flexible substrate that is bendable, foldable, and/or rollable. The substrate SUB may be single-layered or multi-layered. The substrate SUB may be a substrate in which at least one base layer and at least one inorganic layer, which include polymer resins sequentially stacked, are alternately stacked.

The transistor TR may include a semiconductor, a gate electrode, a source electrode, and a drain electrode. An insulating film or insulating layer VIA may be disposed on the transistor TR. The insulating film VIA may include an organic insulating material such as a general purpose polymer such as poly(methyl methacrylate) (PMMA) or polystyrene (PS), a polymer derivative having a phenolic group, an acryl-based polymer, an imide-based polymer, a polyimide, a siloxane-based polymer, or a combination thereof. For example, the insulating film VIA may include a polyimide.

A first electrode 191 may be disposed on the insulating film VIA. The first electrode may be electrically connected to the transistor TR to receive a voltage, and may be connected to a drain electrode (not shown) of the transistor TR. The first electrode 191 may include a transparent conductive oxide, for example, an indium tin oxide (ITO).

Referring to FIG. 1, a partition wall or bank (hereinafter "partition wall") 350 may be disposed on the first electrode 191. The partition wall 350 may have a stacked structure including a first layer 351 and a second layer 352. However, in another embodiment, the partition wall 350 may be a single layer. The first layer 351 and the second layer 352 of the partition wall 350 may include, e.g., an inorganic material. For example, the first layer 351 and the second layer 352 of the partition wall 350 may include one or more of a silicon oxide ($SiO_x$), a silicon nitride ($SiN_x$), a silicon oxynitride ($SiO_xN_y$), and amorphous silicon (a-Si), or a combination thereof. The first layer 351 and the second layer 352 may include different materials or a same material.

The second layer 352 may include a groove H1. The groove formed in the second layer 352 may have a structure in which an inner width W2 thereof is wider than an inlet width W1 thereof. The groove H1 may prevent a side leakage current of a high-resolution structure by disconnecting a common layer of adjacent pixels.

The width W2 of the inside of the groove H1 may be substantially equal to or greater than about 1.5 times the width W1 of the inlet. Although separately described below, in case that the inner width W2 of the groove H1 is less than about 1.5 times the inlet width W1 thereof, a hole injection layer HIL may not be sufficiently disconnected. For example, the inlet width W1 of the groove H1 may be in a range of about 0.5 μm to about 3 μm.

A height of the groove H1 may be greater than a thickness of the hole injection layer HIL to be formed later, and may be thinner than a thickness of the light emitting layer. The height of the groove H1 may be greater than the thickness of the hole injection layer HIL, and the hole injection layer HIL may be effectively disconnected. The height of the groove H1 may be smaller than the thickness of the light emitting layer, and the inlet of the groove H1 may be covered by the light emitting layer.

Referring to FIG. 1, the hole injection layer HIL may be disposed on the first electrode 191. In this case, the hole injection layer HIL may be commonly disposed on first electrodes 191 connected to each of the transistors TR.

As shown in FIG. 1, the hole injection layer HIL commonly disposed in respective first electrodes 191 may be divided by the groove H1 of the partition wall 350. As shown in FIG. 1, in the process of forming the hole injection layer HIL, the hole injection layer HIL may be formed inside the groove H1 of the partition wall 350, and the hole injection layers HIL of adjacent pixels may be completely separated from each other without being connected. Accordingly, technical problems such as a side leakage current occurring between the hole injection layers HIL between adjacent pixels may be solved. Effects of the disclosure will be separately described in detail below.

Referring to FIG. 1, the hole injection layer HIL may be disposed in the groove H1. This is because the hole injection layer HIL material may be deposited inside the groove H1 instead of on an upper portion of the partition wall 350 during the formation of the hole injection layer HIL, and as the hole injection layer HIL may be formed inside the groove H1 in this way, the hole injection layer HIL of adjacent pixels may be divided without being connected to each other.

Next, referring to FIG. 1, a light emitting layer 360 may be disposed on the hole injection layer HIL. As shown in FIG. 1, the light emitting layer 360 emitting different colors may be disposed for each pixel. In FIG. 1, a red light emitting layer 360R and a green light emitting layer 360G are illustrated, and although not illustrated in FIG. 1, a blue light emitting layer (not illustrated) may be located in an adjacent pixel. However, the embodiments are not limited thereto, and, for example, a structure in which adjacent pixels emit the same color by including the same light emitting layer is also possible.

Referring to FIG. 1, the light emitting layer 360 may be disposed inside the groove H1. This is because the light emitting layer 360 material may be deposited into the groove H1 during the formation of the light emitting layer 360. However, the inlet of the groove H1 may be blocked by the formation of the light emitting layer 360. For example, as shown in FIG. 1, according to the formation of the light emitting layer 360 having a certain thickness, the inlet of the groove H1 may be covered with the light emitting layer 360 to be closed. Accordingly, a layer deposited after the light emitting layer 360 in a subsequent process may not be formed inside the groove H1.

Next, referring to FIG. 1, a second electrode 270 may be disposed on the light emitting layer 360. The second electrode 270 may be commonly disposed in pixels. As described above, the inlet of the groove H1 of the partition wall 350 may be blocked by the light emitting layer 360, and the second electrode 270 may be connected to all of the pixels without being disconnected by the groove H1 and be disposed.

The first electrode 191, the hole injection layer HIL, the light emitting layer 360, and the second electrode 270 may configure or form a light emitting device LED. Although not shown, a hole transport layer disposed between the hole injection layer HIL and the light emitting layer 360, and an electron transport layer and an electron injection layer disposed between the light emitting layer 360 and the second electrode 270 may be further included. The hole transport layer, the electron transport layer, and the electron injection layer may also be commonly disposed in the pixels.

As described above, in the display device according to an embodiment, the partition wall 350 may include the groove H1. The groove H1 may solve technical problems such as the leakage current between adjacent pixels by allowing the common layer between the adjacent pixels, for example, the hole injection layer HIL, to be divided without being connected to each other.

Figure 2:
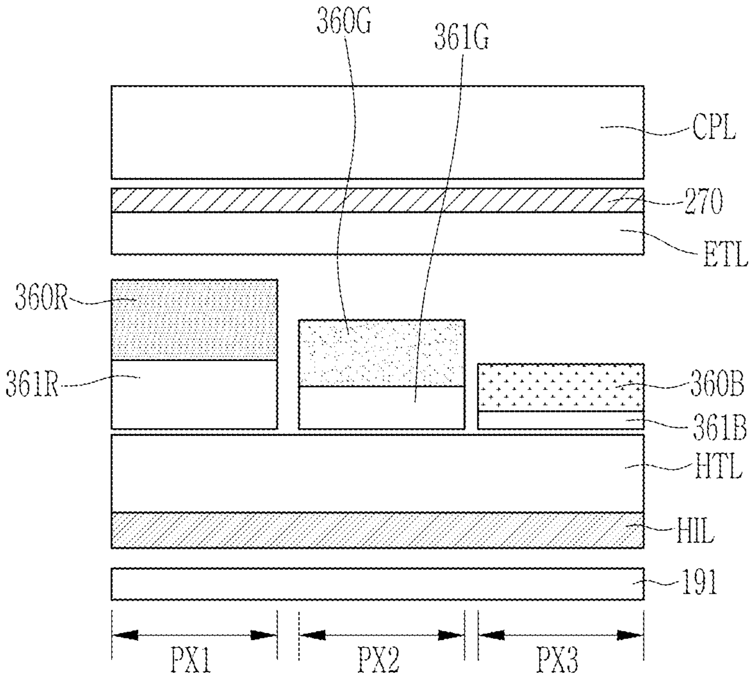
FIG. 2 schematically illustrates a stacked structure of pixels.

FIG. 2 schematically illustrates a stacked structure of pixels. Referring to FIG. 2, the hole injection layer HIL may be disposed on the first electrode 191. In FIG. 2, a configuration common to respective pixels PX1, PX2, and PX3 is shown as one. The first electrode 191 and the hole injection layer HIL may be commonly disposed in respective pixels PX1, PX2, and PX3. Similarly, the hole transport layer HTL may be commonly disposed in respective pixels PX1, PX2, and PX3.

The first pixel PX1 may include a first auxiliary layer 361R and a first light emitting layer 360R. The second pixel PX2 may also include a second auxiliary layer 361G and a second light emitting layer 360G. The third pixel PX3 may also include a third auxiliary layer 361B and a third light emitting layer 360B.

An electron transport layer ETL may be commonly disposed on the first light emitting layer 360R, the second light emitting layer 360G, and the third light emitting layer 360B. The second electrode 270 may be disposed on the electron transport layer ETL, and a capping layer CPL may be disposed on the second electrode 270.

As shown in FIG. 2, each pixel may apply a common hole injection layer to improve hole injection characteristics. In this case, the hole injection layer HIL may include a doped hole transport layer material. For example, the hole injection layer HIL may be a doping layer and may have higher electrical conductivity than the hole transport layer. Therefore, a side leakage current problem may occur due to the conductive feature.

In case that the leakage current occurs in this way, efficiency of a pixel decreases and color purity deteriorates, and adjacent pixels may be weakly lit due to the leakage current, which may cause color mixing.

Figure 3:
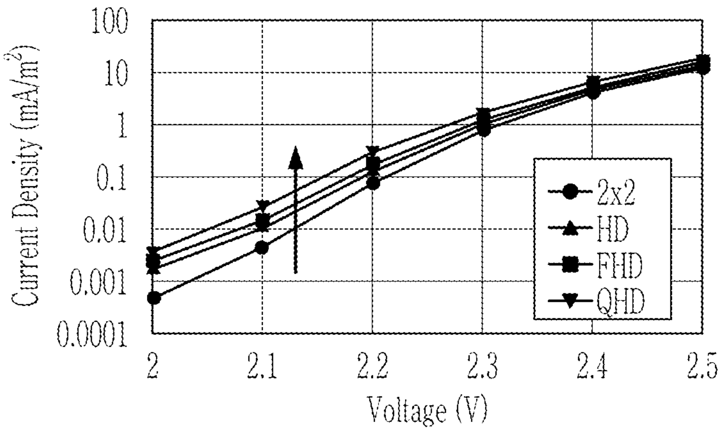
FIG. 3 illustrates current densities with respect to voltages in case that resolution is 2×2, HD, FHD, and QHD.

In the case of high resolution, the distance between adjacent pixels may be narrow, and the side leakage current problem may increase. FIG. 3 illustrates current densities with respect to voltages when resolution is 2×2, HD, FHD, and QHD. Referring to FIG. 3, it can be seen that the current density increases as the resolution increases (from 2×2 to QHD).

Figure 4:
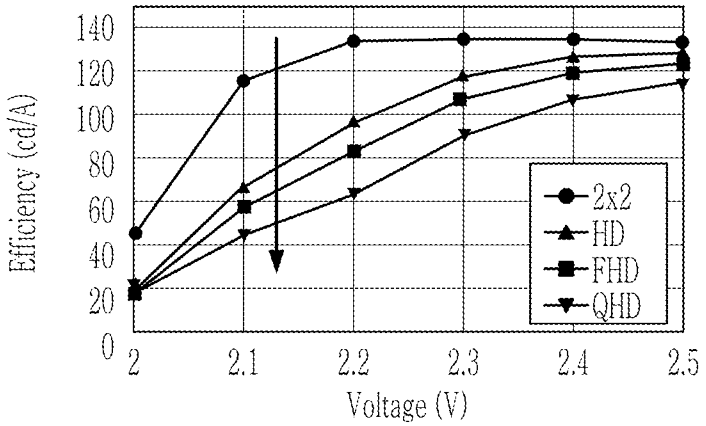
FIG. 4 illustrates efficiencies with respect to voltages in case that resolution is 2×2, HD, FHD, and QHD.

FIG. 4 illustrates efficiencies with respect to voltages when resolution is 2×2, HD, FHD, and QHD. Referring to FIG. 4, it can be seen that the efficiency decreases as the resolution increases (from 2×2 to QHD). This is because as described above, as the resolution increases, the distance between adjacent pixels decreases and the leakage current increases. The efficiency of the pixel is reduced due to the increased leakage current.

However, in the display device according to the embodiment, as described above, the partition wall 350 disposed between adjacent pixels may include the groove H1, and the common layer such as the hole injection layer HIL may be divided and the generation of the leakage current may be prevented.

The partition wall 350 according to the embodiment may have a shape in which the inner width W2 of the groove is wider than the inlet width W1 of the groove, and the common layer may be completely divided and disconnected.

Figure 5:
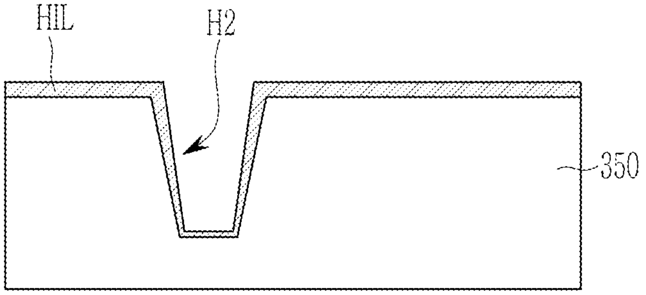
FIG. 5 schematically illustrates an embodiment in which a groove having a constant width is formed in a partition wall.
Figure 6:
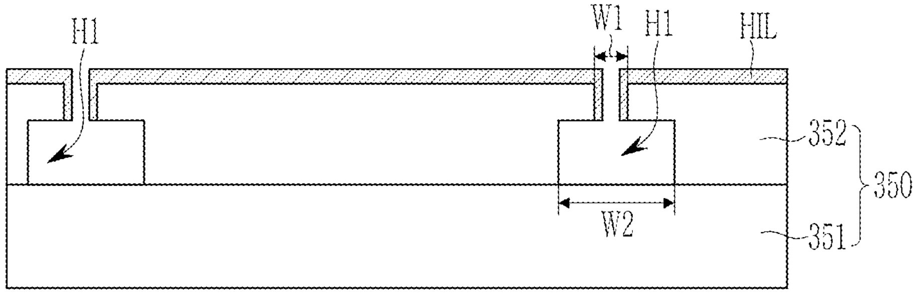
FIG. 6 schematically illustrates an embodiment in which a groove of a partition wall has a shape in which an inner width thereof is wider than an inlet width thereof.

FIG. 5 illustrates a case in which a groove H2 having a constant width is formed in the partition wall 350, and FIG. 6 illustrates a case in which the inner width W2 of the groove H1 of the partition wall 350 is wider than the inlet width W1 thereof, as in the embodiment.

Referring to FIG. 5, in case that the groove H2 having a typical shape is formed in the partition wall 350, the hole injection layer HIL may not be completely disconnected. For example, as shown in FIG. 5, the hole injection layer HIL may be formed by being connected along a side surface of the groove H2, and a leakage current may not be completely controlled due to incomplete disconnection.

However, in the case of FIG. 6, the hole injection layer HIL may include the groove H1 having a shape in which the inner width W2 is wider than the inlet width W1, and the hole injection layer HIL may be effectively disconnected. As shown in FIG. 6, the hole injection layers HIL may be completely disconnected without being connected to each other due to the space inside the groove H1.

Figure 7:
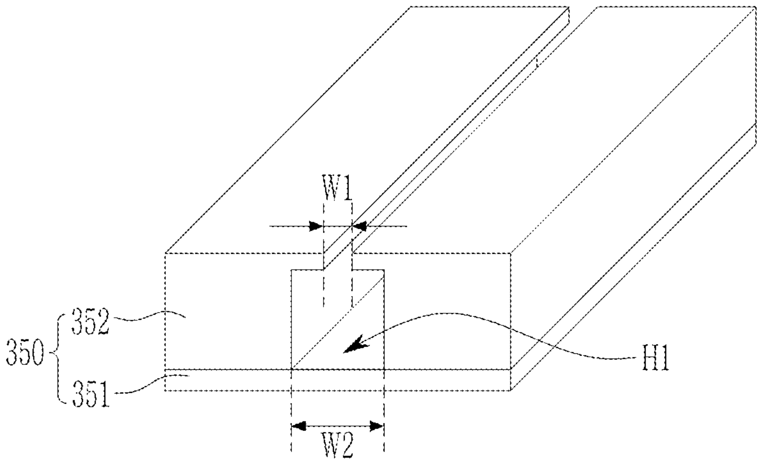
FIG. 7 schematically illustrates the groove of the partition wall according to the embodiment from another angle, and FIG. 8 schematically illustrates a configuration in which a wire is disconnected when a hole injection layer is formed on the partition wall of FIG. 7.
Figure 8:
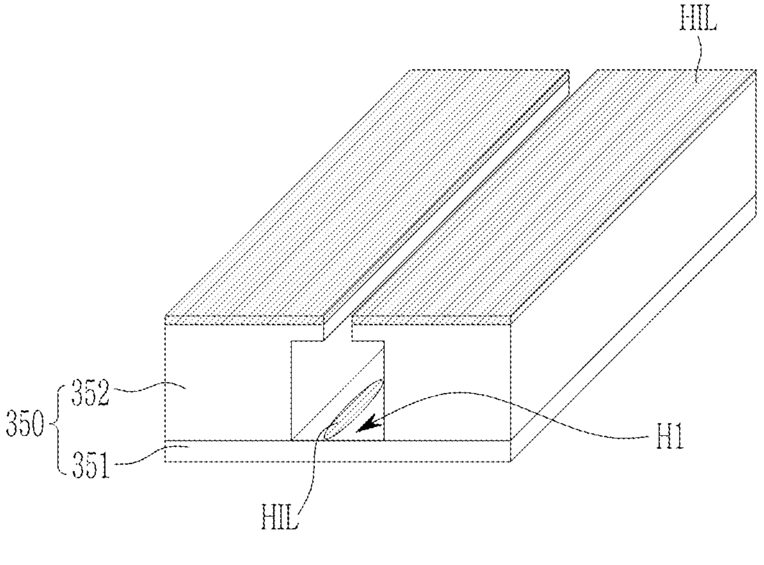

FIG. 7 illustrates the groove H1 of the partition wall 350 according to the embodiment from another angle, and FIG. 8 illustrates a configuration in which the hole injection layer HIL is disconnected when the hole injection layer HIL is formed on the partition wall 350.

As shown in FIG. 7, the inner width W2 of the groove H1 may be wider than the inlet width W1 there. In this case, the inner width W2 may be substantially equal to or greater than about 1.5 times the inlet width W1. In case that the inner width W2 may be less than about 1.5 times the inlet width W1, the hole injection layer HIL may not be sufficiently disconnected. In this case, the inlet width W1 of the groove H1 may be in a range of about 0.5 μm to about 3 μm. For example, even in the case of a high-resolution display device with a narrow distance between pixels, the hole injection layer HIL may be disconnected by forming the fine pattern groove as described above.

Referring to FIG. 8, when the hole injection layer HIL is formed on the partition wall 350 in which the groove H1 is formed, the hole injection layer HIL may be disconnected between adjacent pixels as the hole injection layer HIL is formed inside the groove H1. In this case, by appropriately controlling the inlet width W1 of the groove H1, the conductive common layer may be properly disconnected as needed.

Hereinafter, a process of forming the display device according to the embodiment will be described with reference to FIG. 9 to FIG. 12. FIG. 9 to FIG. 12 illustrate a manufacturing method of a display device according to an embodiment.

Figure 9:
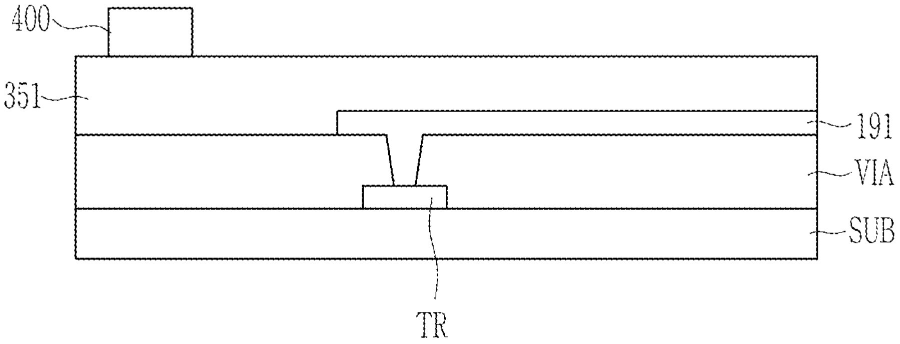
FIG. 9 to FIG. 12 schematically illustrate a manufacturing method of a display device according to an embodiment.

Referring to FIG. 9, the first layer 351 of the partition wall may be formed on the first electrode 191. In this case, the first layer 351 may include an inorganic material. For example, the first layer 351 of the partition wall 350 may include one or more of a silicon oxide ($SiO_x$), a silicon nitride ($SiN_x$), a silicon oxynitride ($SiO_xN_y$), and amorphous silicon (a-Si), or a combination thereof.

Next, a metal pattern 400 may be formed on the first layer 351 of the partition wall. The metal pattern 400 may be a structure for forming a groove in the partition wall. The metal pattern 400 may include, e.g., molybdenum or aluminum. However, this is just an example, and the material of the metal pattern 400 is not limited thereto.

A thickness of the metal pattern 400 may be thicker than that of the hole injection layer HIL formed later. The thickness of the metal pattern 400 may be thinner than that of the light emitting layer formed later. In this way, in case that the thickness of the metal pattern 400 is thicker than that of the hole injection layer HIL and thinner than that of the light emitting layer, the groove H1 formed later by the metal pattern 400 may effectively disconnect the hole injection layer HIL. In case that the thickness of the metal pattern 400 is smaller than the thickness of the light emitting layer, the inlet of the groove H1 may be effectively covered. In the process of patterning the metal pattern 400, one mask may be used.

Figure 10:
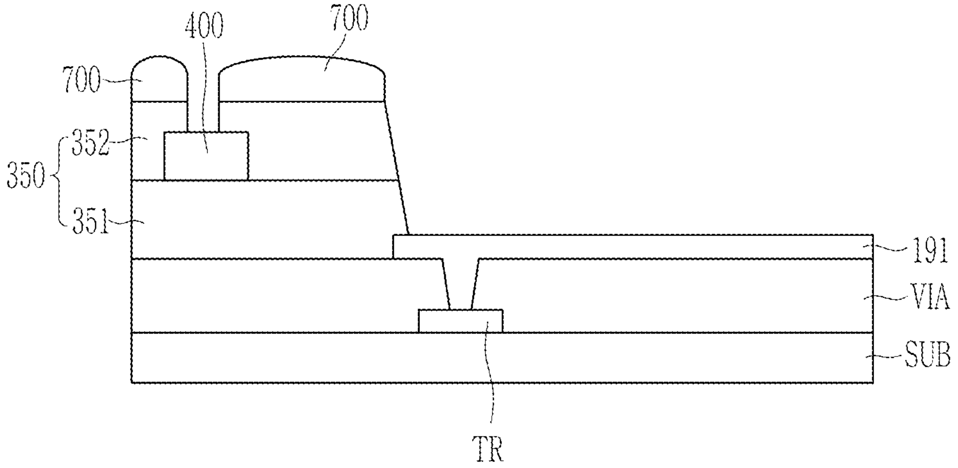

Next, referring to FIG. 10, the second layer 352 of the partition wall may be formed. The second layer 352 may also include an inorganic material. For example, the second layer 352 of the partition wall 350 may include one or more of a silicon oxide ($SiO_x$), a silicon nitride ($SiN_x$), a silicon oxynitride ($SiO_xN_y$), and amorphous silicon (a-Si), or a combination thereof. The first layer 351 and the second layer 352 may include the same material, or may include different materials.

After forming the second layer 352, the first layer 351 and the second layer 352 overlapping the first electrode 191 may be removed. In this case, the second layer 352 overlapping the metal pattern 400 may be removed to expose the metal pattern 400. In this process, one mask 700 may be used. In case that the metal pattern 400 includes molybdenum, only the second layer 352 may be etched without etching the metal pattern 400 because it has excellent selectivity compared to the inorganic film.

Figure 11:
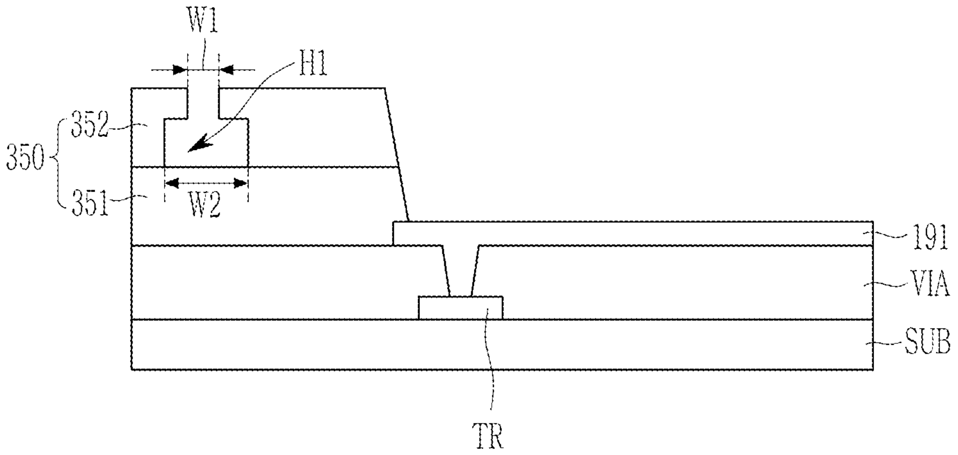

Next, referring to FIG. 11, the metal pattern 400 may be removed. In this case, the removal of the metal pattern 400 may be performed by using wet etching. By removing the metal pattern 400, the groove H1 with the inner width W2 wider than the inlet width W1 may be formed.

Figure 12:
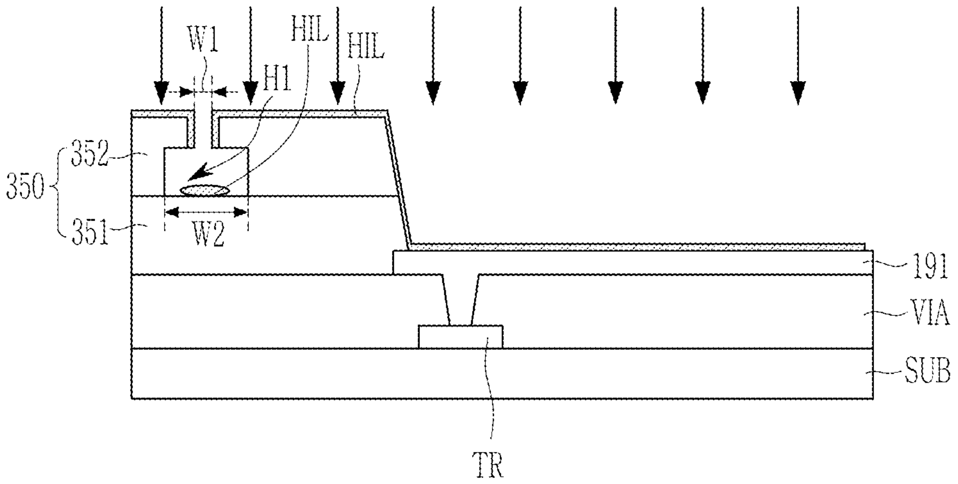

Next, referring to FIG. 12, the hole injection layer HIL may be formed. The hole injection layer HIL may be disconnected by the groove H1. For example, as shown in FIG. 12, as the hole injection layer HIL is formed inside the groove H1, the hole injection layer HIL may be divided at the upper portion of the partition wall 350 without being connected. Accordingly, it is possible to prevent a current from leaking to a side surface between adjacent pixels.

In the embodiment, the first layer 351 and the second layer 352 of the partition wall 350 may include the same material or different materials. In case that the first layer 351 and the second layer 352 include the same material, the boundary between the first layer 351 and the second layer 352 may not be visually recognized.

Figure 13:
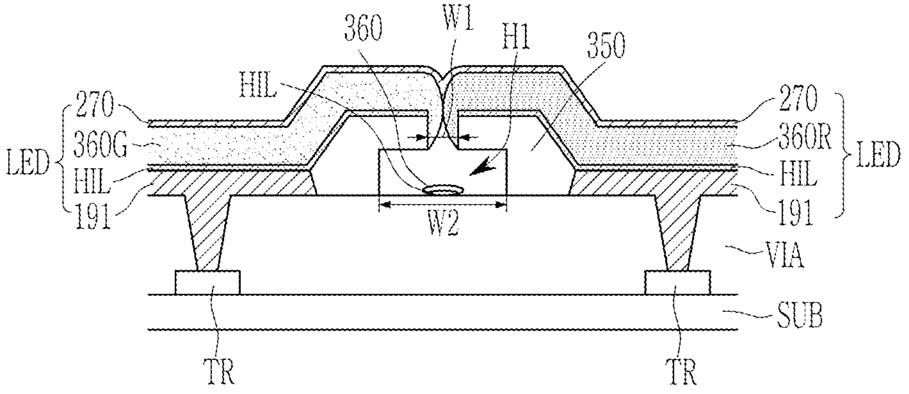
FIG. 13 schematically illustrates the same cross-sectional view as FIG. 1 for a display device according to another embodiment.

FIG. 13 illustrates the same cross-sectional view as FIG. 1 for a display device according to another embodiment. Referring to FIG. 13, the partition wall 350 may be a single layer. In the case of FIG. 13, it is formed by the same manufacturing method as in FIG. 9 to FIG. 12, but the first layer 351 and the second layer 352 may include a same material, and the boundary therebetween may not be visually recognized to be seen as a single layer.

Figure 14:
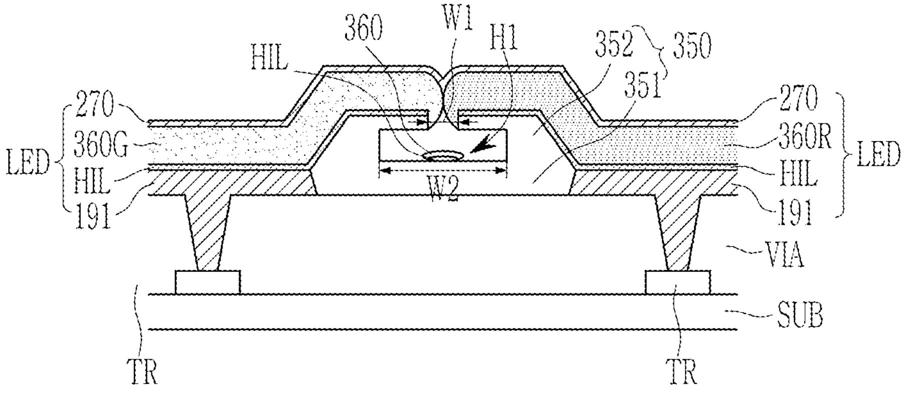
FIG. 14 schematically illustrates the same cross-sectional view as FIG. 1 for a display device according to another embodiment.

In addition, the partition wall 350 may be a single layer. For example, in the manufacturing process, the first electrode 191 and the metal pattern 400 may be disposed on the same layer, and the first electrode 191 and the groove H1 may be disposed on the same layer. FIG. 14 illustrates the same cross-sectional view as FIG. 1 for a display device according to another embodiment. Referring to FIG. 14, the embodiment of FIG. 14 may be distinguishable from the embodiment of FIG. 1 at least in that the partition wall 350 is a single layer and the groove H1 of the partition wall 350 is disposed on the same layer as the first electrode 191. Repetitive descriptions of the same components may be omitted below.

In addition, in the embodiment, a configuration in which the inner shape of the groove H1 is a quadrangular shape is illustrated, but in some embodiments, the shape thereof may be changed. For example, the shape of the groove H1 may be changed according to the shape of the metal pattern 400.

Figure 15:
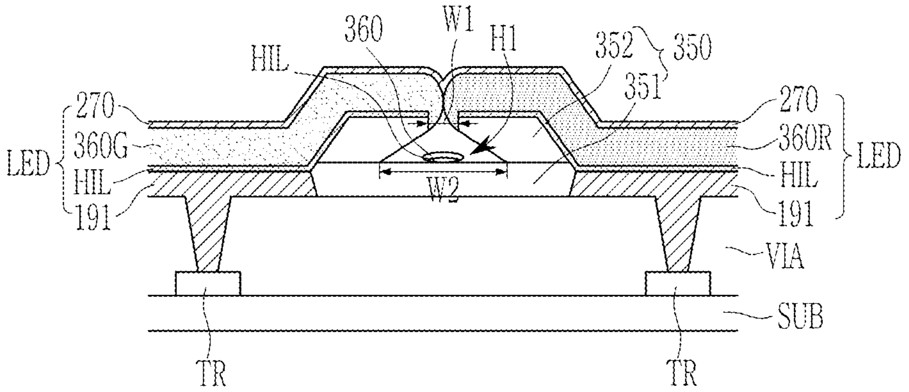
FIG. 15 schematically illustrates the same cross-sectional view as FIG. 1 for a display device according to another embodiment.

FIG. 15 illustrates the same cross-sectional view as FIG. 1 for a display device according to another embodiment. Referring to FIG. 15, the display device according to the embodiment is distinguishable from that of FIG. 1 at least in that the shape of the groove H1 of the partition wall 350 is a triangular shape. Repetitive descriptions of the same components are omitted below. FIG. 15 shows a configuration in which the shape of the groove H1 is a triangular shape, but the shape of the groove H1 is not limited thereto, and may be various shapes such as a circular shape or a polygonal shape. This is because it may vary depending on the shape of the metal pattern 400 during the manufacturing process.

As described above, in the display device and the manufacturing method thereof according to the embodiment, the partition wall 350 may include the groove H1, and the groove H1 may have the structure in which the inner width W2 is wider than the inlet width W1. The common layer of adjacent pixels, for example, the hole injection layer, may be disconnected by the groove H1 of this shape, thereby preventing occurrence of leakage current between the adjacent pixels. Accordingly, side current leakage may be prevented in a high-resolution display device, and efficiency and color purity of a pixel may be improved.

The above description is an example of technical features of the disclosure, and those skilled in the art to which the disclosure pertains will be able to make various modifications and variations. Thus, the embodiments of the disclosure described above may be implemented separately or in combination with each other.

The embodiments disclosed in the disclosure are intended not to limit the technical spirit of the disclosure but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
a plurality of transistors disposed on a substrate;
an insulating layer disposed on the plurality of transistors;
a first electrode disposed on the insulating layer and electrically connected to at least one of the plurality of transistors;
a partition wall disposed on the insulating layer; and
a common layer disposed on the partition wall and the first electrode, wherein
the partition wall includes a groove,
the groove has a shape having an inner width that is substantially equal to or greater than about 1.5 times wider than an inlet width, and
the common layer is disposed inside the groove.

2. The display device of claim 1, wherein the inlet width of the groove is in a range of about 0.5 μm to about 3 μm.

3. The display device of claim 1, wherein the partition wall includes an inorganic material.

4. The display device of claim 1, wherein the common layer disposed on the first electrode and an adjacent common layer disposed on an adjacent first electrode include a same material.

5. The display device of claim 4, wherein the common layer disposed on the first electrode is separated from the adjacent common layer disposed on the adjacent first electrode by the groove.

6. The display device of claim 1, wherein the common layer is a hole injection layer.

7. The display device of claim 6, wherein the hole injection layer includes a doped hole transport layer material.

8. The display device of claim 1, further comprising:
a light emitting layer disposed on the common layer.

9. The display device of claim 8, wherein the light emitting layer blocks an inlet of the groove.

10. The display device of claim 8, wherein the light emitting layer is disposed inside the groove.

11. The display device of claim 10, wherein the height of the groove is smaller than a thickness of the light emitting layer.

12. The display device of claim 8, further comprising:
a second electrode disposed on the light emitting layer.

13. The display device of claim 12, wherein the second electrode is formed of a single plate overlapping a plurality of first electrodes.

14. The display device of claim 1, wherein a height of the groove is greater than a thickness of the common layer.

15. The display device of claim 1, wherein
the partition wall includes a first layer and a second layer, and
the groove is disposed in the second layer.

16. The display device of claim 15, wherein the first layer and the second layer include different materials.

17. A manufacturing method of a display device, comprising:

preparing a substrate including a plurality of transistors and a first electrode electrically connected to at least one of the plurality of transistors;

forming a metal pattern on the substrate;

forming a partition wall layer on the metal pattern;

forming an opening overlapping the metal pattern by patterning the partition wall layer;

etching the metal pattern to form a groove in the partition wall layer; and forming a common layer on the partition wall layer and the first electrode, wherein the groove has a shape having an inner width wider than an inlet width, and the common layer is formed inside the groove.

18. The manufacturing method of the display device of claim 17, wherein the inner width of the groove is substantially equal to or greater than about 1.5 times the inlet width of the groove.

19. The manufacturing method of the display device of claim 17, wherein the common layer is separated from an adjacent common layer disposed on the first electrode by the groove.

20. The manufacturing method of the display device of claim 17, wherein the common layer is a hole injection layer.

21. The manufacturing method of the display device of claim 17, further comprising:

forming a light emitting layer disposed on the common layer, wherein the light emitting layer blocks an inlet of the groove.

22. The manufacturing method of the display device of claim 21, wherein the light emitting layer is disposed inside the groove.

23. The manufacturing method of the display device of claim 21, wherein a thickness of the metal pattern is greater than a thickness of the common layer.

24. The manufacturing method of the display device of claim 23, wherein the thickness of the metal pattern is smaller than a thickness of the light emitting layer.

25. The manufacturing method of the display device of claim 21, further comprising:

forming a second electrode on the light emitting layer, wherein the second electrode is formed of a single plate overlapping a plurality of first electrodes.

* * * * *